(12) United States Patent
Schmidt et al.

(10) Patent No.: US 10,832,763 B2
(45) Date of Patent: Nov. 10, 2020

(54) GLOBAL BIT LINE LATCH PERFORMANCE AND POWER OPTIMIZATION

(71) Applicant: International Business Machines Corporation, New Armonk, NY (US)

(72) Inventors: Martin Bernhard Schmidt, Stuttgart (DE); Harry Barowski, Schoenaich (DE); Alexander Fritsch, Esslingen (DE); Matthias Hock, Holzgerlingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/223,413

(22) Filed: Dec. 18, 2018

(65) Prior Publication Data

US 2020/0194060 A1 Jun. 18, 2020

(51) Int. Cl.
| | | |
|---|---|---|
| G11C 11/419 | (2006.01) | |
| G11C 5/14 | (2006.01) | |
| G11C 11/412 | (2006.01) | |
| G11C 7/10 | (2006.01) | |
| G11C 7/12 | (2006.01) | |
| G11C 7/18 | (2006.01) | |

(52) U.S. Cl.
CPC ............ *G11C 11/419* (2013.01); *G11C 5/147* (2013.01); *G11C 7/106* (2013.01); *G11C 7/1087* (2013.01); *G11C 7/12* (2013.01); *G11C 7/18* (2013.01); *G11C 11/412* (2013.01)

(58) Field of Classification Search
None
See application file for complete search history.

(56) References Cited

U.S. PATENT DOCUMENTS

| | | | | |
|---|---|---|---|---|
| 5,790,458 A | * | 8/1998 | Lee | G11C 7/067 365/185.21 |
| 5,936,890 A | * | 8/1999 | Yeom | G11C 16/10 365/185.22 |
| 8,199,602 B2 | | 6/2012 | Rao et al. | |

(Continued)

FOREIGN PATENT DOCUMENTS

WO 2014190049 A1 11/2014

OTHER PUBLICATIONS

Aibin Yan et al.; "A Double-Node-Upset Self-Recoverable Latch Design for High Performance and Low Power Application"; Dated: Jun. 19, 2018; 5 pages.

(Continued)

*Primary Examiner* — J. H. Hur
(74) *Attorney, Agent, or Firm* — Cantor Colburn LLP; William Kinnaman (57) ABSTRACT

Embodiments for global bit line latch performance and power optimization are described herein. An aspect includes a bit line including a first section, a second section, and coupling circuitry arranged between the first section and the second section, the coupling circuitry adapted to causes a voltage drop between the first section and the second section, and at least one logic element including a first branch connected to a first power supply and a second branch connected to a second power supply, wherein the first branch is connected to the first section of the bit line, and wherein the second branch is connected to the second section of the bit line.

18 Claims, 6 Drawing Sheets

(56) References Cited

U.S. PATENT DOCUMENTS

| | | |
|---|---|---|
| 8,451,675 B2 | 5/2013 | Roy et al. |
| 9,542,997 B2 | 1/2017 | Anvar et al. |
| 2002/0126531 A1* | 9/2002 | Hosono ............... G11C 11/5621 365/185.17 |
| 2003/0016562 A1* | 1/2003 | Im ....................... G11C 7/1039 365/189.02 |
| 2003/0133340 A1* | 7/2003 | Lee .................... G11C 16/3454 365/200 |
| 2005/0162918 A1* | 7/2005 | Kim ...................... G11C 16/10 365/185.22 |
| 2006/0171212 A1* | 8/2006 | Kim ...................... G11C 16/26 365/189.05 |
| 2006/0209601 A1* | 9/2006 | Kim .................... G11C 7/1039 365/189.05 |
| 2010/0214849 A1* | 8/2010 | Jin ........................ G11C 7/065 365/185.22 |
| 2014/0347928 A1* | 11/2014 | Lee .................... G11C 16/0483 365/185.11 |

OTHER PUBLICATIONS

Minsik Cho et al.; "LatchPlanner: Latch Placement Algorithm for Datapath-oriented High-Performance VLSI Designs"; Dated: Dec. 23, 2013; 7 pages.

\* cited by examiner

GLOBAL BIT LINE LATCH PERFORMANCE AND POWER OPTIMIZATION

BACKGROUND

The present techniques relate to computer memory. More specifically, the techniques relate to global bit line latch performance and power optimization.

Computer memory may be organized in a hierarchy, from processor registers, over multiple cache levels, to external main memory. The highest or uppermost cache level is the one closest to the processor, and the lowest cache level is the one closest to the main memory. Access latency is lowest, and bandwidth is highest, for registers and upper cache levels. For example, a data word in core static random access memory (SRAM) may be accessed in 1 clock cycle. For the cache, accessing a data word may require two to tens of cycles, and for the main memory, up to hundreds of cycles.

On a memory level, the memory is partitioned into arrays, which make up random access memory (RAM) cores. The RAM cores are designed to have a relatively small physical area. The cores are combined into a memory array. Memory arrays are gathered together into units and then connected into cache memory by multiplexers. At the array level, data is organized in words, with each word having a respective address. Each bit of each word is stored in a single cell. An SRAM cell may include 6 transistors, including two cross-coupled inverters (including 4 transistors) and two access transistors (or word line transistors). Write data is transmitted to the cells by bit lines. Read data is transmitted from the cell to the read-out circuit using either one of the two-bit lines or using both bit lines. The number of cells on a bit line can be any appropriate number, for example, from 16 to 1024 cells per bit line.

These cells can be read out using a global bit line when the data of several local bit lines are combined. The wire or node of the global bit line connects all local evaluation circuits. This wire is typically long thus having a large capacitance. Charging and discharging the large capacitance of the global bit line can make up a significant part of the read-power in a memory array.

SUMMARY

Embodiments of the present invention are directed to a circuit. A non-limiting example of the circuit includes a bit line including a first section, a second section, and coupling circuitry arranged between the first section and the second section, the coupling circuitry adapted to causes a voltage drop between the first section and the second section, and at least one logic element including a first branch connected to a first power supply and a second branch connected to a second power supply, wherein the first branch is connected to the first section of the bit line, and wherein the second branch is connected to the second section of the bit line.

Embodiments of the present invention are directed to a memory. A non-limiting example of the memory includes at least one memory block including a plurality of memory cells coupled to a pair of bit lines, a global bit line coupled to at least one memory block, the global bit line includes a first section, a second section, and coupling circuitry arranged between the first section and the second section, the coupling circuitry adapted to causes a voltage drop between the first section and the second section, and at least one logic element including a first branch connected to a first power supply and a second branch connected to a second power supply, wherein the first branch is connected to the first section of the global bit line, and wherein the second branch is connected to the second section of the global bit line.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describe having a communications path between two elements and does not imply a direct connection between the elements with no intervening elements/connections between them. All of these variations are considered a part of the specification.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Figure 1:
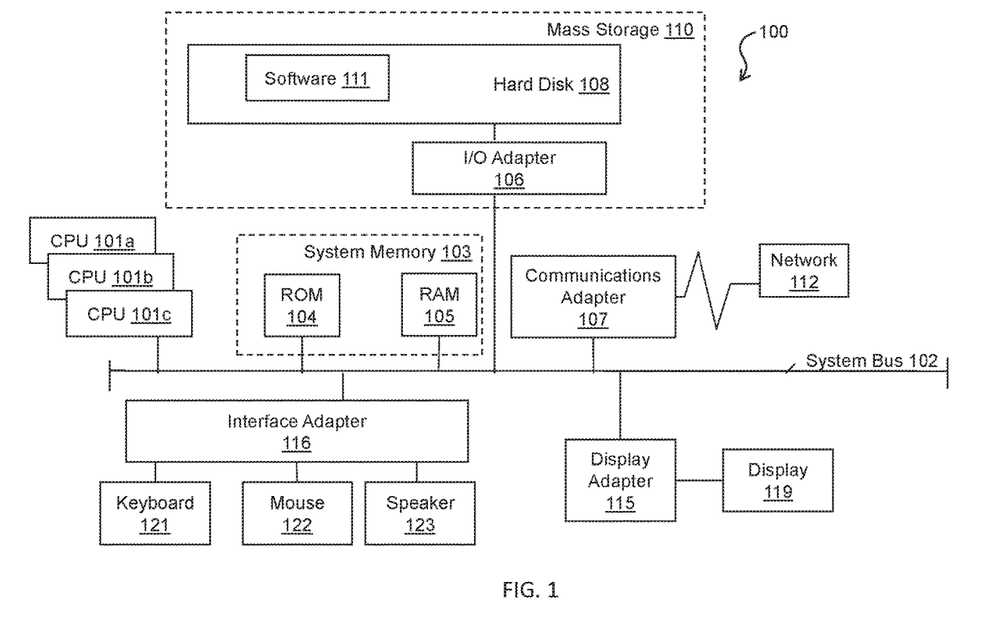
FIG. 1 depicts a block diagram of a computer system for use in implementing one or more embodiments of the present invention.

Turning now to FIG. 1, a computer system 100 is generally shown in accordance with an embodiment. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others. The computer system 100 may be, for example, a server, desktop computer, laptop computer, tablet computer, or smartphone. In some examples, computer system 100 may be a cloud computing node. Computer system 100 may be described in the general context of computer system executable instructions, such as program modules, being executed by a computer system. Generally, program modules may include routines, programs, objects, components, logic, data structures, and so on that perform particular tasks or implement particular abstract data types. Computer system 100 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, the computer system 100 has one or more central processing units (CPU(s)) 101a, 101b, 101c, etc. (collectively or generically referred to as processor(s) 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and may include a basic input/output system (BIOS), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 may be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 may be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which may be an outside network, enabling the computer system 100 to communicate with other such systems. In one embodiment, a portion of the system memory 103 and the mass storage 110 collectively store an operating system, which may be any appropriate operating system, such as the z/OS or AIX operating system from IBM Corporation, to coordinate the functions of the various components shown in FIG. 1.

Additional input/output devices are shown as connected to the system bus 102 via a display adapter 115 and an interface adapter 116. In one embodiment, the adapters 106, 107, 115, and 116 may be connected to one or more I/O buses that are connected to the system bus 102 via an intermediate bus bridge (not shown). A display 119 (e.g., a screen or a display monitor) is connected to the system bus 102 by a display adapter 115, which may include a graphics controller to improve the performance of graphics intensive applications and a video controller. A keyboard 121, a mouse 122, a speaker 123, etc. can be interconnected to the system bus 102 via the interface adapter 116, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

In some embodiments, the communications adapter 107 can transmit data using any suitable interface or protocol, such as the internet small computer system interface, among others. The network 112 may be a cellular network, a radio network, a wide area network (WAN), a local area network (LAN), or the Internet, among others. An external computing device may connect to the computing system 100 through the network 112. In some examples, an external computing device may be an external webserver or a cloud computing node.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1 (e.g., additional memory components, embedded controllers, modules, additional network interfaces, etc.). Further, the embodiments described herein with respect to computer system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
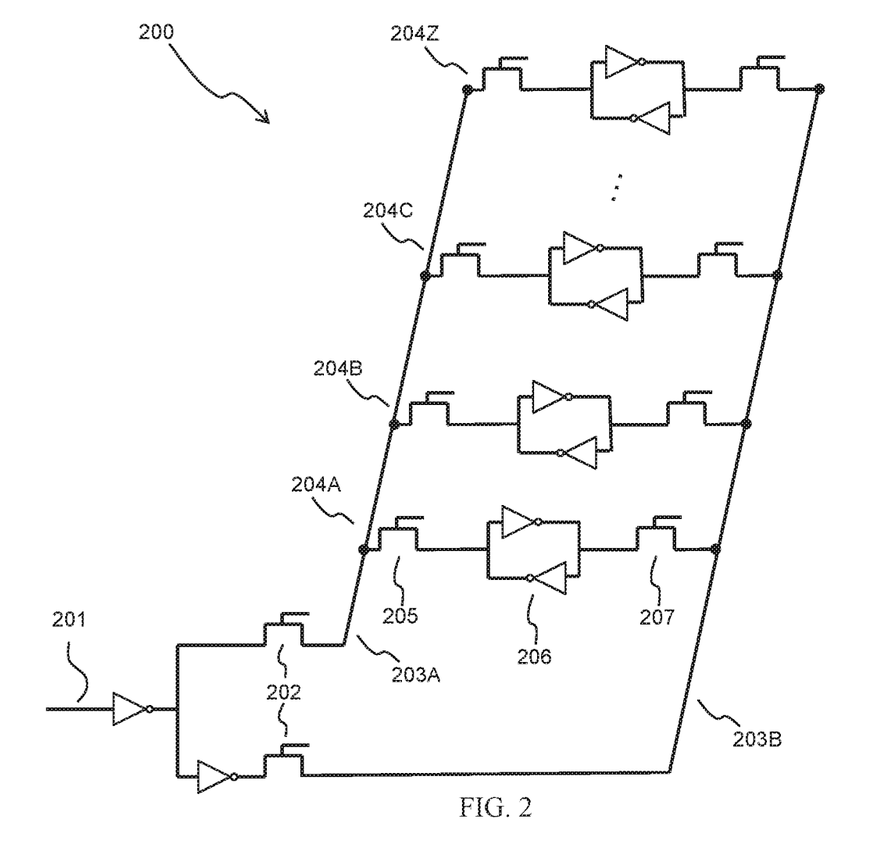
FIG. 2 depicts a block diagram of an example static random access memory (SRAM) according to one or more embodiments of the invention.

FIG. 2 is a block diagram of example bit line 200 of static random access memory (SRAM) in accordance with an embodiment. The bit line 200 of FIG. 2 may comprise, for example, any of the memory in a computer system such as computer system 100, such as RAM 105, and/or cache memory in CPUs 101a-c. A computer memory may be made up of a plurality of bit lines such as bit line 200. A data input 201 is provided to write transistors 202. Write transistors control write access to the cells 204A-Z in the bit line 200. When the gates of the write transistors 202 are activated, the value on the data input 201 is transmitted to the complementary bit line 203A and the true bit line 203B. The bit line 200 as shown includes a plurality of cells 204A-Z; a bit line 200 such as is shown in FIG. 2 may include any appropriate number of cells in various embodiments. Each of the cells 204A-Z is connected across the complementary bit line 203A and the true bit line 203B. As shown in FIG. 2, a cell 204A includes two word line transistors 205 and 207, and cross-coupled inverter 206, which may hold a value of '0' or '1'. Each of the data cells 204A-Z includes respective word line transistors and a cross-coupled inverter. The word line transistors 205 and 207 are used to activate the individual cells in the bit line for reads and writes; each cell 204 A-Z has a respective word line that is addressed by a word line decoder that is connected to the bit line 200.

During a read operation, one or both of the word line transistors 205 and 207 may be activated, or opened, to connect a cell such as cell 204A to bit line 203A and/or 203B. The data stored in cross-coupled inverter 206 will pull the connected bit line to the positive or negative supply rail voltage depending on the content (i.e., '0' or '1') that is stored in the cross-coupled inverter 206. During a write operation in a cell such as cell 204A, both word line transistors 205 and 207 are activated. The cell pulls the connected bit lines 203A-B to the positive or to the negative supply rail voltage. The array write transistors 202 connect the bit lines 203A-B with the data input 201. If the write data on data input 201 is of opposite polarity to the data held in the cross-coupled inverter 206 of the cell 204A, a short circuit current may flow across the cell 204A for a relatively short amount of time in order to flip the contents of the cell. This short-circuit condition is called contention. To reduce contention, in some embodiments, the data input driver voltage is made large enough to overwrite the cell voltage quickly. Reduced contention may lead to power savings, enable a shorter cycle time, and reduce aging effects on the transistors and the surrounding metal layers in the memory that includes bit line 200.

It is to be understood that the block diagram of FIG. 2 is not intended to indicate that the bit line 200 is to include all of the components shown in FIG. 2. Rather, the bit line 200 can include any appropriate fewer or additional components not illustrated in FIG. 2 (e.g., additional transistors, inverters, lines, cells, counters, a driver tree, a word decoder, etc.). Further, the embodiments described herein with respect to bit line 200 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Turning now to an overview of technologies that are more specifically relevant to aspects of the invention, a common feature of most modern memories is the use of a hierarchical bit line arrangement in which, instead of a single bit line that runs the complete height of a column of memory cells and connects to each cell in the column, a multi-level structure is used. Effectively, a single bit line is broken up into multiple "local bit lines," each of which connects to the memory cells in a part of the column. A "global bit line" also runs the height of the column, and is connected to the local bit lines via switches (latches). The memory read and write circuits connect to the global bit line, and not directly to the local bit line. During a memory access, only a local bit line in the relevant part of the column is connected (via its local-to-global switch) to the global bit line.

Figure 3A:
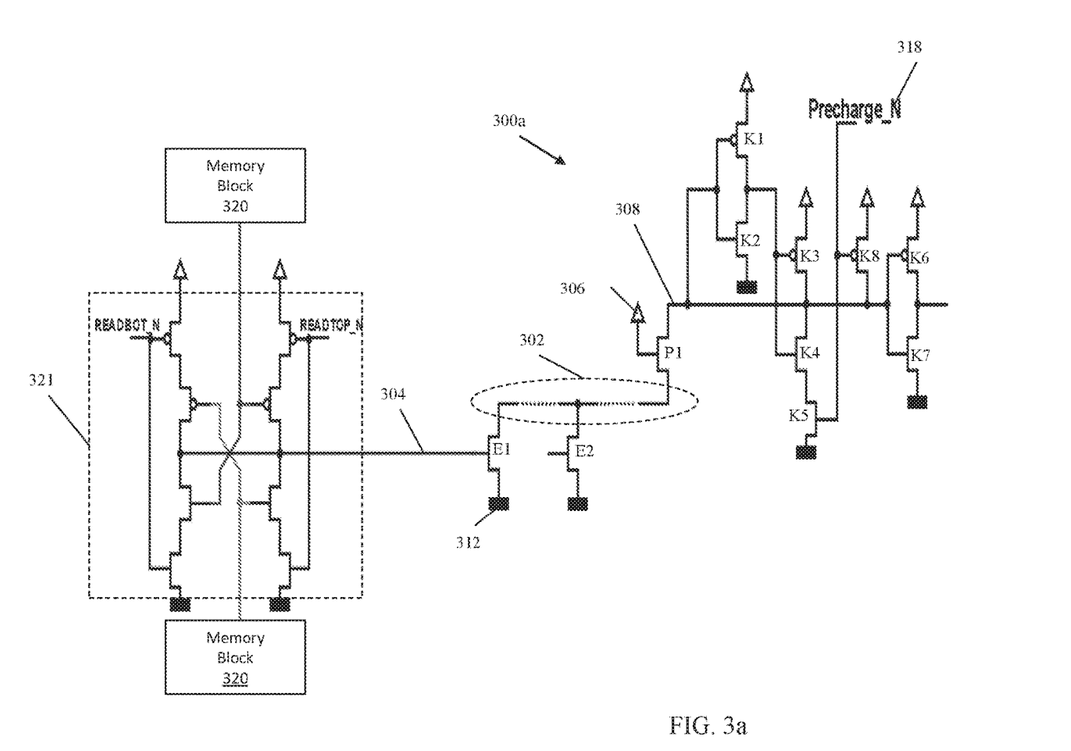
FIG. 3a depicts a block diagram of a topology including a keeper circuit coupled to a global bit line with a pass switching element in accordance with one or more embodiments of the invention.

FIG. 3a depicts a block diagram of a topology 300a including a keeper circuit coupled to a global bit line with a pass switching element in accordance with one or more embodiments of the invention. The topology 300a includes a communication node 302 which gathers data from sensing circuits E1, E2 coupled to the communication node 302. The sensing circuit E1, E2 gates are coupled to a read circuit 322 through a read line 304. The read circuit 321 is coupled to memory blocks 320. Each sensing circuit E1, E2 is coupled to a negative power supply ($V_{SS}$) 312. While only two sensing circuits are shown in the illustrative example, any positive number of sensing circuits can be coupled to the communication line 302. In one or more embodiments of the invention, the memory blocks 320 can be an SRAM array as depicted in FIG. 2, for example. The local bit lines from the memory blocks 320 are read using the read circuit 322. Because of the number of local bit lines in typical memory configurations, the bus for the communication node 302 can be long and can exhibit a large capacitance. A pass FET P1 can be utilized when the data of several local bit lines are combined. In embodiments of the invention, the pass FET P1 can be an nFET with a gate connected to a positive power supply 306 ($V_{DD}$). The pass FET P1 connects the communication node 302 to the global bit line 308. The pass FET P1 can be utilized when the data for several local bit lines are combined.

The topology 300a also includes a pre-charging circuit 318 that is coupled to a keeper circuit through the global bit line 308. The keeper circuit includes devices K1-K8. The keeper circuit is coupled to the global bit line 308 in order to provide feedback to the global bit line 308 to hold the state of the global bit line 308 when the pre-charging circuit 318 signal is no longer being applied. The elements of the keeper circuit include a plurality of nFETs (K2, K4, K5, and K7) and a plurality of pFETs (K1, K3, K6, and K8). The keeper circuit includes a keeper driver (K1, K2) where the output of the keeper driver is coupled to the input of a keeper inverter (K3, K4, K5). The keeper circuit also includes an output inverter (K6, K7). The transistors of the keeper circuit can be configured to be strong enough to resist noise and leakage that would otherwise cause the global bit line 308 to errantly discharge to a low value or to a high value. At the same time, however, the transistor devices can be weak enough to allow the global bit line 308 to quickly charge and discharge when required to do so.

Before an evaluation phase, the global bit line 308 is pre-charged. For a read of 0, the local bit line drops to $V_{SS}$.

The pull-down device in the sensing circuits E1, E2 will then pull the communication node 302 to $V_{SS}$ as well. For a read of 1, no pull-down device on the communication node 302 is activated. The pull-down devices will nevertheless draw current from the local bit lines because of leakage. The 1-value is protected by the keeper circuit which will provide that leakage current. One of ordinary skill in the art will recognize that "0" and "1" refer to logical "zero" and "one" values, respectively.

As noted above, the charging and discharging the large capacitance of the communication node 302 can be responsible for a significant portion of the power draw of a read operation. The pass FET P1 is utilized to reduce the charge on the communication node 302 by separating the global bit line 308 and the communication node 302. In one or more embodiments of the invention, at the beginning of the pre-charge phase, the communication node 302 has a voltage at $V_{SS}$ and the pass FET P1 will see a large gate-to-source (GS) voltage. The voltage on the communication line 302 rises and the GS voltage at the pass FET P1 will drop accordingly. When the GS voltage reached the threshold voltage ($V_{TH}$), the pass FET P1 will enter subthreshold mode. Consequently, the voltage on the communication node 302 will not rise above $V_{DD}-V_{TH}$.

In the evaluation phase, one of the pull-down device in the sensing circuits (E1, E2) pulls the voltage on the communication node to $V_{SS}$. The pass FET P1 conducts weakly at first because P1 is still in sub-threshold mode. When the communication node 302 drops further, the pass FET P1 will conduct better and the global bit line 308 voltage will drop as well. When the global bit line 308 voltage drops, the pFET branch (K3) of the keeper inverter will conduct better and will "fight" against the voltage drop on the global bit line 308 and thus, the communication node 302 as well. The voltage drop on the global bit line 308 and at the input of the keeper driver (K1, K2) leads to an increased voltage at the input of the keeper inverter (K3, K5). When the trip point of the keeper inverter is reached, the source current from the keeper pFET (K3) and the sink current from the keeper nFET (K5) cancel. Soon thereafter, the keeper inverter helps with inverting the global bit line. The pFET K3 will no longer provide current to the global bit line 308 latch and the global bit line 308 will be pulled down to $V_{SS}$ by the nFET branch K4, K5 of the keeper.

Figure 3B:
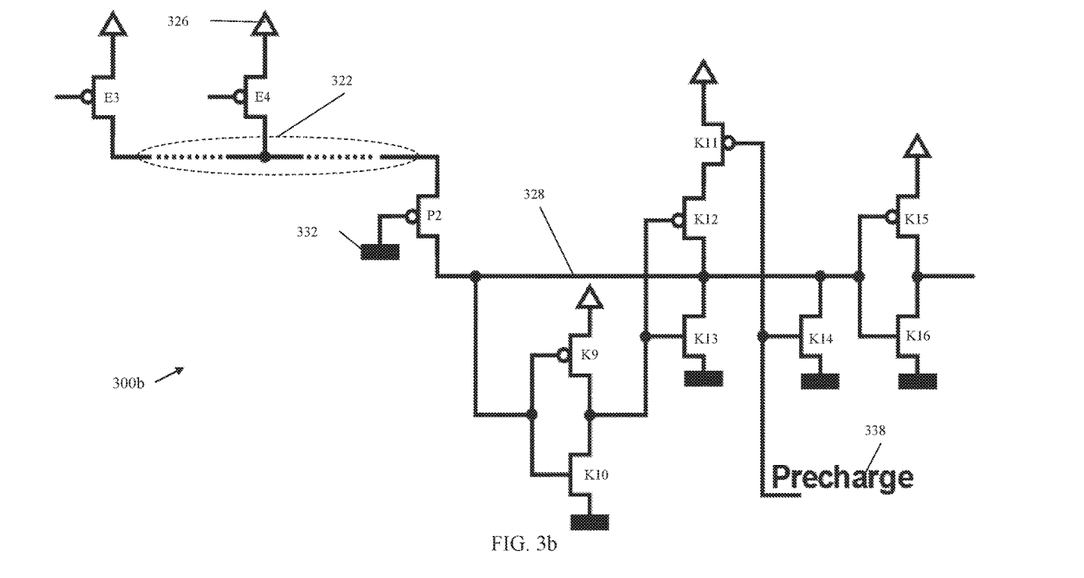
FIG. 3b depicts a block diagram of a complementary topology including a keeper circuit coupled to a global bit line with a pass switching element in accordance with one or more embodiments of the invention.

FIG. 3b depicts a block diagram of a topology 300b including a keeper circuit coupled to a global bit line with a pass switching element in accordance with one or more embodiments of the invention. The topology 300b includes a communication node 322 which gathers data from sensing circuits E3, E4 coupled to the communication node 322. The sensing circuits E3, E4 gates are coupled to a read circuit through a read line. The read circuit is coupled to memory blocks (not shown). Each sensing circuit E3, E4 is coupled to a positive power supply ($V_{DD}$) 326. While only two sensing circuits are shown in the illustrative example, any positive number of sensing circuits can be coupled to the communication line 322. Because of the number of local bit lines in typical memory configurations, the bus for the communication node 322 can be long and can exhibit a large capacitance. A pass FET P2 can be utilized when the data of several local bit lines are combined. In embodiments of the invention, the pass FET P2 can be a pFET with a gate connected to a negative power supply 332 ($V_{SS}$). The pass FET P2 connects the communication node 322 to the global bit line 328. The pass FET P2 can be utilized when the data for several local bit lines are combined.

The topology 300b also includes a pre-charging circuit 338 that is coupled to a keeper circuit through the global bit line 328. The keeper circuit includes devices K9-K16. The keeper circuit is coupled to the global bit line 328 in order to provide feedback to the global bit line 328 to hold the state of the global bit line 328 when the pre-charging circuit 338 signal is no longer being applied. The elements of the keeper circuit include a plurality of pFETs (K9, K11, K12, K15) and a plurality of nFETs (K10, K13, K14, K16). The keeper circuit includes a keeper driver (K9, K10) where the output of the keeper driver is coupled to the input of a keeper inverter (K11, K12, K13). The keeper circuit also includes an output inverter (K15, K16). The transistors of the keeper circuit can be configured to be strong enough to resist noise and leakage that would otherwise cause the global bit line 328 to errantly discharge to a low value or to a high value. At the same time, however, the transistor devices can be weak enough to allow the global bit line 328 to quickly charge and discharge when required to do so.

Figure 4A:
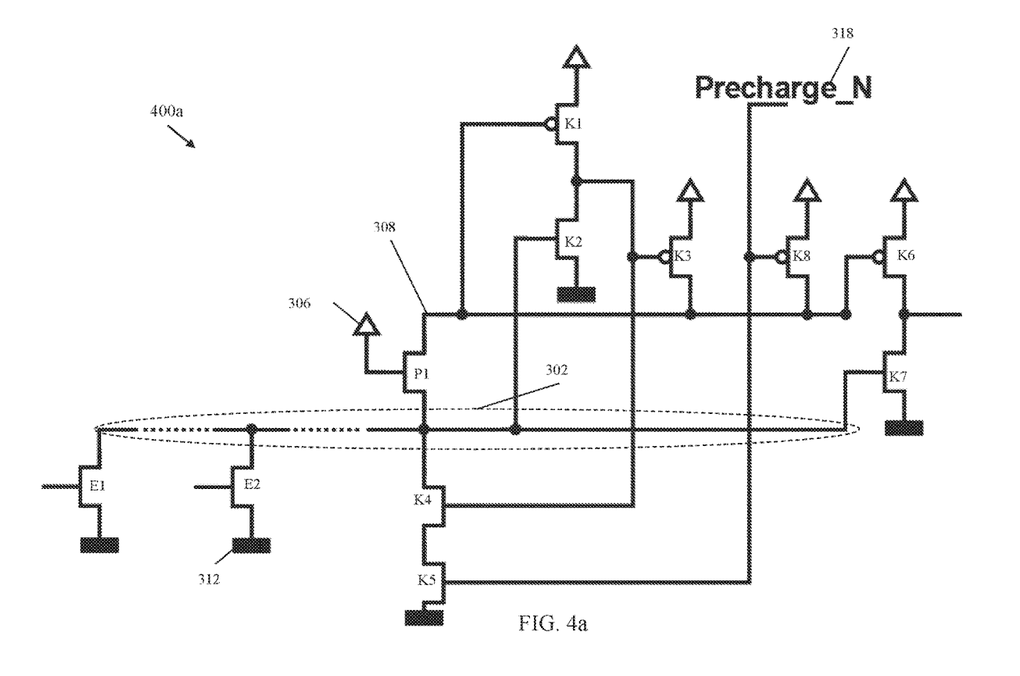
FIG. 4a depicts a block diagram of a circuit topology for global bit line power and performance optimization according to one or more embodiments of the invention.

FIG. 4a depicts a block diagram of a circuit topology 400a for global bit line power optimization and performance according to one or more embodiments of the invention. The circuit topology 400a includes the communication node 302 coupled to the pass FET P1 and the sensing circuits E1, E2. As previously described in FIG. 3a, the sensing circuit E1, E2 gates can be coupled to a read circuit for reading from a memory. The nFET branch (K4, K5) of the keeper inverter is coupled to the communication node 302. The gate of the keeper driver nFET K2 and the gate of the output driver nFET K7 are coupled to the communication node 302 as well. Having these nFETs (K2, K4, K5, K7) arranged in this manner allows for the reduction of capacitance on the global bit line 308 which has the benefit of a lower latency on the global bit line 308. Also, the cross current is reduced on the driver inverter for the keeper and the output inverter during pre-charge phase which results in lower power consumption.

In one or more embodiments of the invention, the nFET branch K4, K5 with drains coupled to the communication node 302 instead of the global bit line 308 will reduce the capacitance on the global bit line 308. As a result during the evaluate phase, the keeper pFET branch K3, K8 remain in a low current mode for a longer period of time and the falling slope of the global bit line 308 will begin later but will be steeper.

In one or more embodiments of the invention, during the evaluate phase, the communication node 302 voltage either stays at $V_{DD}-V_{TH}$ or is pulled down to VSS. The global bit line 308 follows the communication node 302 with a delay and either stays at $V_{DD}$ or is pulled down to VSS through the transfer nFET P1. If the global bit line 308 stays high, all the nFETs where the gate is coupled to the global bit line 308 conduct a whole cycle. In the second case where the global bit line 308 is pulled low, the nFETs where the gate is coupled to the communication node 302 are switched off faster. The communication node 302 drops faster to VSS than the global bit line 308 because the voltage, when high, is $V_{DD}-V_{TH}$, as described above.

Figure 4B:
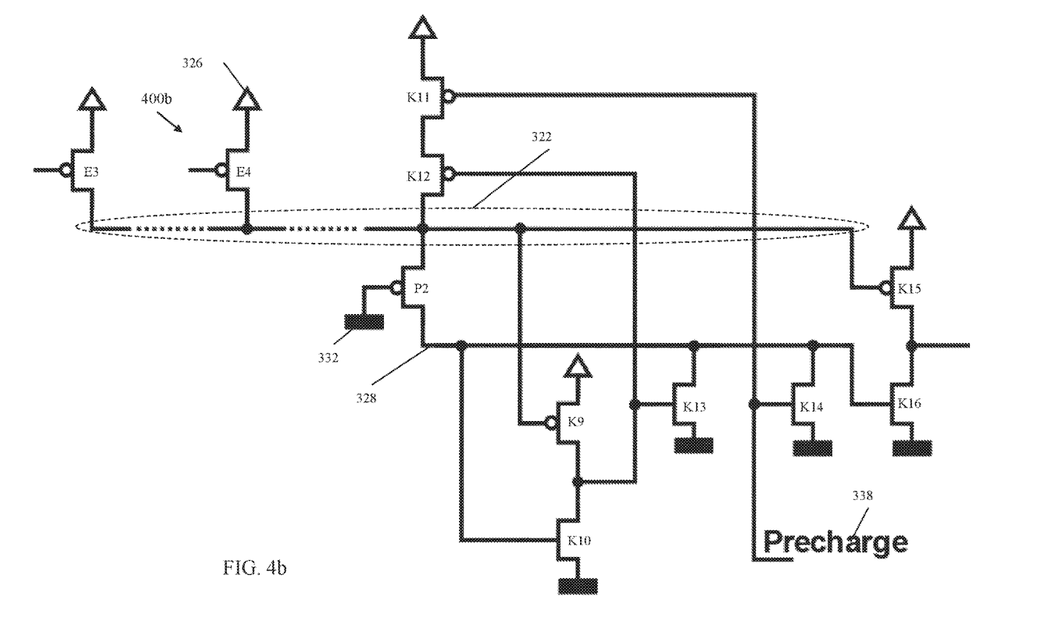
FIG. 4b depicts a block diagram of a circuit topology for global bit line power and performance optimization according to one or more embodiments of the invention.

FIG. 4b depicts a block diagram of a circuit topology 400b for global bit line power and performance optimization according to one or more embodiments of the invention. The circuit topology 400b includes the communication node 322 coupled to the pass FET P2 and the sensing circuits E3, E4. The pass FET P2 gate is coupled to a positive power supply ($V_{DD}$) 326. The circuit topology 400b is a PMOS configuration with the pass FET P2 being a pFET and the evaluation circuits E3, E4 being pFET gates coupled to a read circuit for reading from a memory. The evaluation circuits E3, E4 are coupled to the communication node 322 and to a positive power supply ($V_{DD}$) 326. The pFET branch (K11, K12) of the keeper inverter is coupled to the communication node 322. The gate of the keeper driver pFET K9 and the gate of the output driver pFET K15 are coupled to the communication node 322 as well. Having these pFETs (K11, K12, K9, K15) arranged in this manner allows for the reduction of capacitance on the global bit line 328 which has the benefit of a lower latency on the global bit line 328. Also, the cross current is reduced on the driver inverter for the keeper and the output inverter during pre-charge phase which results in lower power consumption.

In one or more embodiments of the invention, during the evaluation phase, the communication node 322 either stays at $V_{SS}+V_{TH}$ or is pulled up to $V_{DD}$. The global bit line 328 voltage follows the communication node 322 with a delay and either stays at $V_{SS}$ or is pulled up to $V_{DD}$. If the global bit line 328 stays low, all the pFETs where the gate is coupled to the global bit line 328 conduct a whole cycle. In the second case, where the global bit line 328 is pulled high, the pFETs where the gate is coupled to the communication node 322 are switched off faster. The communication node 322 increases faster to $V_{DD}$ than the global bit line 328 because the voltage, when low, is $V_{SS}+V_{TH}$, as described above.

It is to be understood that the block diagram of FIGS. 3a, 3b, 4a, and 4b are not intended to indicate that the topologies 300a, 300b, 400a, and 400b are to include all of the components shown in FIGS. 3a, 3b, 4a, and 4b. Rather, the topologies 300a, 300b, 400a, and 400b can include any appropriate fewer or additional components not illustrated in FIGS. 3a, 3b, 4a, and 4b (e.g., logic gates, lines, etc.). Further, the embodiments described herein with respect to topologies 300a, 300b, 400a, and 400b may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

The present techniques may be a system, a method or an apparatus. The flowchart and block diagrams in the Figures illustrate the architecture, functionality, and operation of possible implementations of systems, methods, and apparatus according to various embodiments of the present techniques. In this regard, each block in the flowchart or block diagrams may represent a module, segment, or portion of logic for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present techniques have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit comprising:
  a bit line comprising a first section, a second section, and coupling circuitry arranged between the first section and the second section, the coupling circuitry adapted to cause a voltage drop between the first section and the second section, wherein the first section is coupled to a read circuit for a memory; and
  a keeper circuit comprising a driver circuit, the driver circuit comprising a first transistor and a second transistor, wherein the first section is connected to a first gate of the first transistor; and wherein the second section is connected to a second gate of the second transistor;
  wherein the keeper circuit further comprises a keeper inverter having a third transistor, a fourth transistor, and a fifth transistor;
  wherein an output of the driver circuit is coupled to a third gate of the third transistor and a fourth gate of the fourth transistor;
  wherein a drain of the fourth transistor is coupled to the first section; and
  wherein the first transistor is connected to a first power supply and the second transistor is connected to a second power supply.

2. The circuit of claim 1, wherein the coupling circuitry comprises an n-channel metal-oxide semiconductor (NMOS) field effect transistor (FET).

3. The circuit of claim 2, wherein a gate of the NMOS FET is coupled to the second power supply.

4. The circuit of claim 1, wherein the coupling circuitry comprises a switching element having a threshold voltage.

5. The circuit of claim 4, wherein the first section has a first voltage; and
  wherein the second section has a second voltage.

6. The circuit of claim 5, wherein the first voltage is less than the second voltage.

7. The circuit of claim 1, wherein the first transistor comprises a p-channel metal-oxide semiconductor (PMOS) field effect transistor; and
  wherein the second transistor comprises an n-channel metal-oxide semiconductor (NMOS) field effect transistor.

8. The circuit of claim 1,
  wherein an output of the driver circuit is coupled to an input of the keeper inverter.

9. The circuit of claim 1 further comprising a pre-charging device configured to pre-charge the second section of the bit line.

10. A memory comprising:
  at least one memory block comprising a plurality of memory cells coupled to a pair of bit lines;
  a global bit line coupled to the at least one memory block, the global bit line comprises a first section, a second section, and coupling circuitry arranged between the first section and the second section, the coupling circuitry adapted to cause a voltage drop between the first section and the second section;
  a keeper circuit comprising a driver circuit, the driver circuit comprising a first transistor and a second transistor, wherein the first section is connected to a first gate of the first transistor; and wherein the second section is connected to a second gate of the second transistor;

wherein the keeper circuit further comprises a keeper inverter having a third transistor, a fourth transistor, and a fifth transistor;

wherein an output of the driver circuit is coupled to a third gate of the third transistor and a fourth gate of the fourth transistor;

wherein a drain of the fourth transistor is coupled to the first section; and wherein the first transistor is connected to a first power supply and the second transistor is connected to a second power supply.

11. The memory of claim 10, wherein the coupling circuitry comprises an n-channel metal-oxide semiconductor (NMOS) field effect transistor (FET).

12. The memory of claim 11, wherein a gate of the NMOS FET is coupled to the second power supply.

13. The memory of claim 10, wherein the coupling circuitry comprises a switching element having a threshold voltage.

14. The memory of claim 13, wherein the first section has a first voltage; and wherein the second section has a second voltage.

15. The memory of claim 14, wherein the first voltage is less than the second voltage.

16. The memory of claim 10, wherein the first transistor comprises a p-channel metal-oxide semiconductor (PMOS) field effect transistor; and wherein the second transistor comprises an n-channel metal-oxide semiconductor (NMOS) field effect transistor.

17. The memory of claim 10, wherein an output of the driver circuit is coupled to an input of a keeper inverter.

18. The memory of claim 10 further comprising a pre-charging device configured to pre-charge the second section of the global bit line.

* * * * *